United States Patent
Nedachi

(10) Patent No.: US 7,164,299 B2
(45) Date of Patent: Jan. 16, 2007

(54) OUTPUT BUFFER CIRCUIT HAVING PRE-EMPHASIS FUNCTION

(75) Inventor: Takaaki Nedachi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/758,535

(22) Filed: Jan. 16, 2004

(65) Prior Publication Data

US 2004/0145394 A1 Jul. 29, 2004

(30) Foreign Application Priority Data

Jan. 17, 2003 (JP) ............................. 2003-010375

(51) Int. Cl.
H03K 3/00 (2006.01)

(52) U.S. Cl. ................... 327/112; 326/26; 375/219; 375/220; 375/346

(58) Field of Classification Search ................ 327/333, 327/108, 109, 112; 326/30, 82, 83, 85, 90, 326/91
See application file for complete search history.

(56) References Cited

U.S. PATENT DOCUMENTS

| | | | |
|---|---|---|---|
| 6,351,172 B1 * | 2/2002 | Ouyang et al. | 327/333 |
| 6,393,062 B1 * | 5/2002 | Furman et al. | 375/252 |
| 6,420,899 B1 * | 7/2002 | Crittenden et al. | 326/30 |
| 6,438,179 B1 * | 8/2002 | Hwang | 375/322 |
| 6,674,313 B1 * | 1/2004 | Kurisu et al. | 327/108 |
| 6,759,868 B1 * | 7/2004 | Helt et al. | 326/30 |
| 2006/0006901 A1 * | 1/2006 | Groen et al. | 326/27 |
| 2006/0034358 A1 * | 2/2006 | Okamura | 375/219 |
| 2006/0071688 A1 * | 4/2006 | Uenishi | 326/82 |
| 2006/0188043 A1 * | 8/2006 | Zerbe et al. | 375/346 |

FOREIGN PATENT DOCUMENTS

| | | |
|---|---|---|
| JP | 05-129926 | 5/1993 |
| JP | 06-061841 | 3/1994 |
| JP | 2000-68816 | 3/2000 |
| JP | 2002-94365 | 3/2002 |
| JP | 2002-094365 | 3/2002 |
| JP | 2003-318723 | 11/2003 |
| JP | 2004-522359 | 7/2004 |

OTHER PUBLICATIONS

Japanese Office Action dated Aug. 5, 2005 (with partial English translation).

* cited by examiner

Primary Examiner—Timothy P. Callahan
Assistant Examiner—Hiep Nguyen
(74) Attorney, Agent, or Firm—McGinn IP Law Group, PLLC

(57) ABSTRACT

An output buffer circuit having a so-called pre-emphasis function of emphasizing a signal waveform in data transmission in an information processing device or the like according to an attenuation of a transmission line, includes a first buffer which receives input of an input signal which gives a logical value of a signal to drive the transmission line and a second buffer which drives the transmission line in cooperation with the first buffer, thereby cutting off, at the time of de-pre-emphasis when the pre-emphasis function is disabled, current flowing through the second buffer.

20 Claims, 9 Drawing Sheets

OUTPUT BUFFER CIRCUIT HAVING PRE-EMPHASIS FUNCTION

BACKGROUND OF THE INVENTION

1. Field of the Invention

The present invention relates to an output buffer circuit having a so-called pre-emphasis function of emphasizing a signal waveform according to attenuation of a transmission line in data transmission at an information processing device or the like and, more particularly, an output buffer circuit having a high-speed output pre-emphasis function which realizes low power, low voltage and low noise.

2. Description of the Related Art

Output buffer circuits having a pre-emphasis function of this kind have been conventionally used particularly in data transmission as output circuits which require long-distance transmission, low voltage and high-speed (high-frequency) operation.

Although the output buffer circuit of this kind is realized in general by a current mode type circuit (circuit handling a signal expressed by the amount of current), the current mode type circuit has a shortcoming that it has a disadvantage in operation at a low power supply voltage because of its structure. With the recent advance of semiconductor integrated circuit microfabrication techniques, however, lower power consumption has been realized by the reduction in an operation voltage to demand operation at a higher speed with a lower power supply voltage.

Proposed as a conventional technique meeting such a demand is the circuit realizing high-speed operation by shortening a propagation delay time from an input unit to an output unit while operating at a low power supply voltage, which is disclosed in Japanese Patent Laying-Open (Kokai) No. 2002-94365. Also proposed is the technique of improving an output buffer circuit operable with low power which is disclosed in Japanese Patent Laying-Open (Kokai) No. 2000-68816.

Among the above-described conventional techniques, the output buffer circuit disclosed in Japanese Patent Laying-Open (Kokai) No. 2002-94365, for example, has a shortcoming that a lack of mechanism of cutting off current when the pre-emphasis function is disabled (at the time of de-pre-emphasis) makes current fluctuate largely, which is not suitable for low power consumption.

Another shortcoming is that due to large current fluctuation, noise is liable to be generated, which is a disadvantage in high-speed transmission.

Since according to the present invention, control circuits (B1 to B4) need to conduct none of such complicated logical operation as a logical product (AND) and a logical sum (OR) by using data to be sent and an output buffer circuit is formed by two stages of inverters from an input unit (TA, TB) to an output unit (SOUT), a delay time is equivalent to that of the output buffer circuit disclosed in Japanese Patent Laying-Open (Kokai) No. 2002-94365 and higher-speed operation than that of the output buffer circuit disclosed in Japanese Patent Laying-Open (Kokai) No. 2000-68816 is possible.

SUMMARY OF THE INVENTION

An object of the present invention is to provide an output buffer circuit having a high-speed output pre-emphasis function which realizes low power, low voltage and low noise through elimination of current fluctuation by cutting off unnecessary current at the time of de-pre-emphasis when the pre-emphasis function is disabled.

Another object of the present invention is to provide an output buffer circuit having optimum current drivability according to conditions of a transmission line to be applied.

According to the first aspect of the invention, an output buffer circuit having a pre-emphasis function of emphasizing a signal waveform in data transmission according to an attenuation of a transmission line, comprises a first buffer which receives an input signal which gives a logical value of a signal to drive the transmission line and a second buffer which drives the transmission line in cooperation with the first buffer, wherein when the pre-emphasis function is disabled, current flowing through the second buffer is cut off.

According to another aspect of the invention, a differential output circuit employing a plurality of output buffer circuits to apply one as a positive output and the other as a negative output circuit, which circuits have a pre-emphasis function of emphasizing a signal waveform in data transmission according to an attenuation of a transmission line, and include a first buffer which receives an input signal which gives a logical value of a signal to drive the transmission line and a second buffer which drives the transmission line in cooperation with the first buffer to, when the pre-emphasis function is disable, cut off current flowing through the second buffer.

According to the present invention, only when a first input signal and a second input signal coincide with each other, a second buffer is turned on to make a first buffer and the second buffer work in cooperation with each other, thereby enabling the pre-emphasis function. When the first input signal and the second input signal fail to coincide with each other, the final stage output of the second buffer is turned off to disable the pre-emphasis function. Accordingly, since the present invention is structured to turn off the second buffer when the pre-emphasis function is disenabled (at the time of de-pre-emphasis), unnecessary current flowing through the second buffer at the time of de-pre-emphasis will be cut off.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 5 is a timing chart for use in explaining operation to be conducted when a pre-emphasis function in the output buffer circuit according to the first embodiment is tuned on;

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
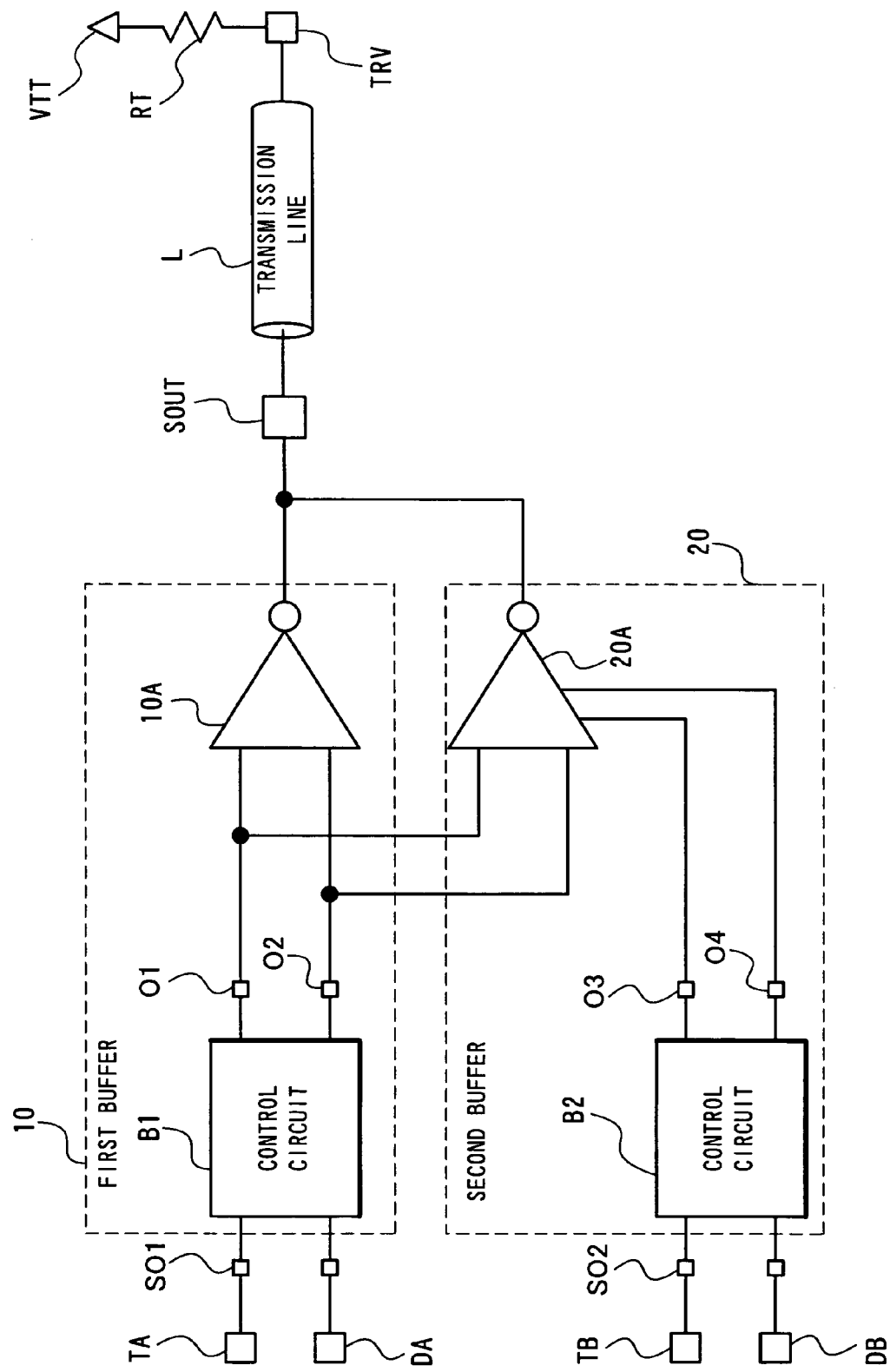
FIG. 1 is a block diagram showing a structure of an output buffer circuit according to a first embodiment of the present invention.
Figure 2:
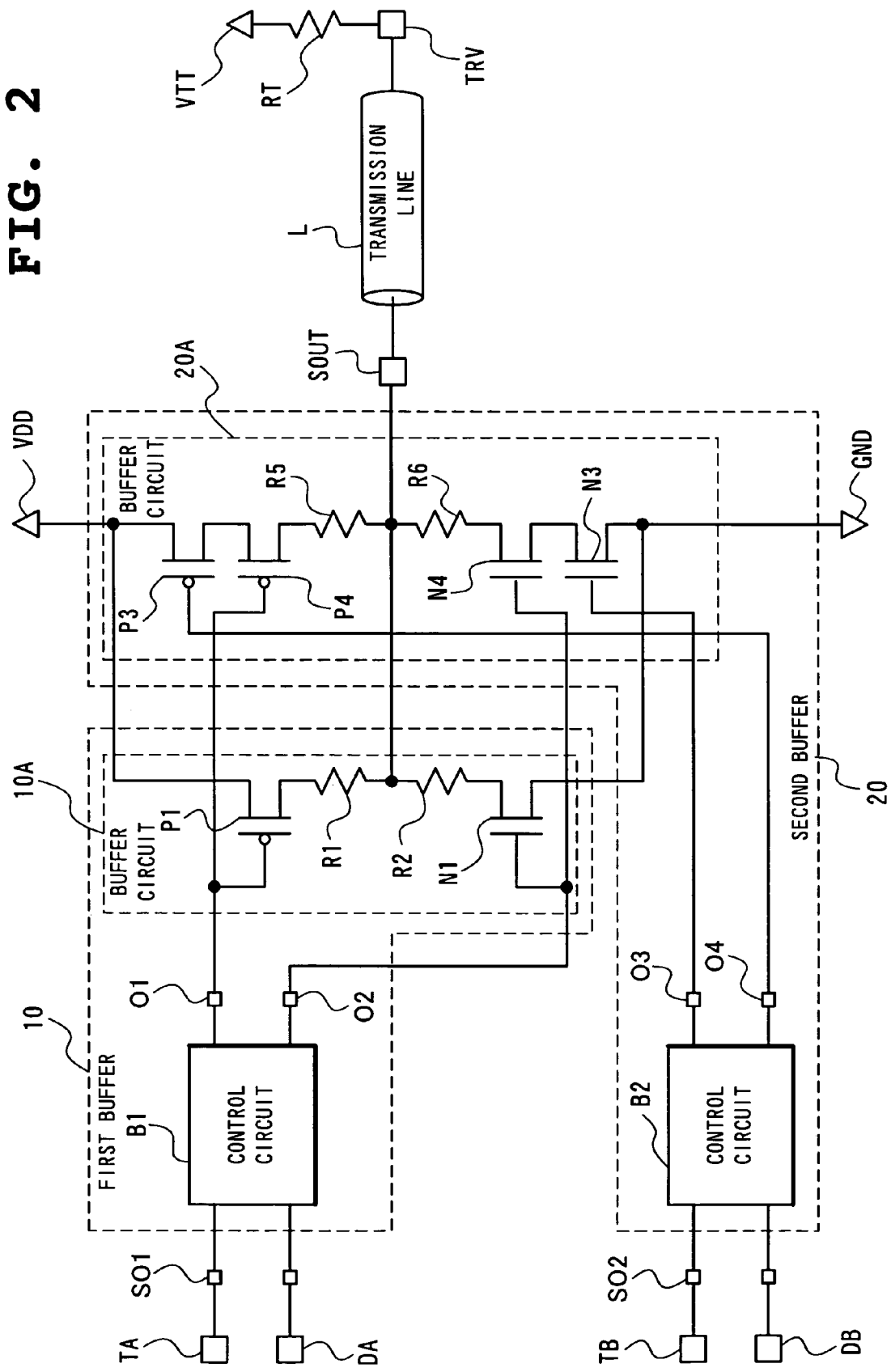
FIG. 2 is a circuit diagram showing a specific circuit structure of the output buffer circuit according to the first embodiment of the present invention.

In the following, embodiments of the present invention will be described in detail with reference to the drawings. FIG. 1 is a block diagram showing a structure of an output buffer circuit according to a first embodiment of the present invention and FIG. 2 is a circuit diagram showing a specific example of the structure.

The output buffer circuit according to the first embodiment drives a transmission line L terminating at a reception terminal TRV at a voltage VTT through a resistor RT.

The output buffer circuit according to the present embodiment includes a first buffer 10 and a second buffer 20, with the first buffer 10 being composed of a buffer circuit 10A and a control circuit B1 and the second buffer 20 being composed of a buffer circuit 20A and a control circuit B2.

Figure 3:
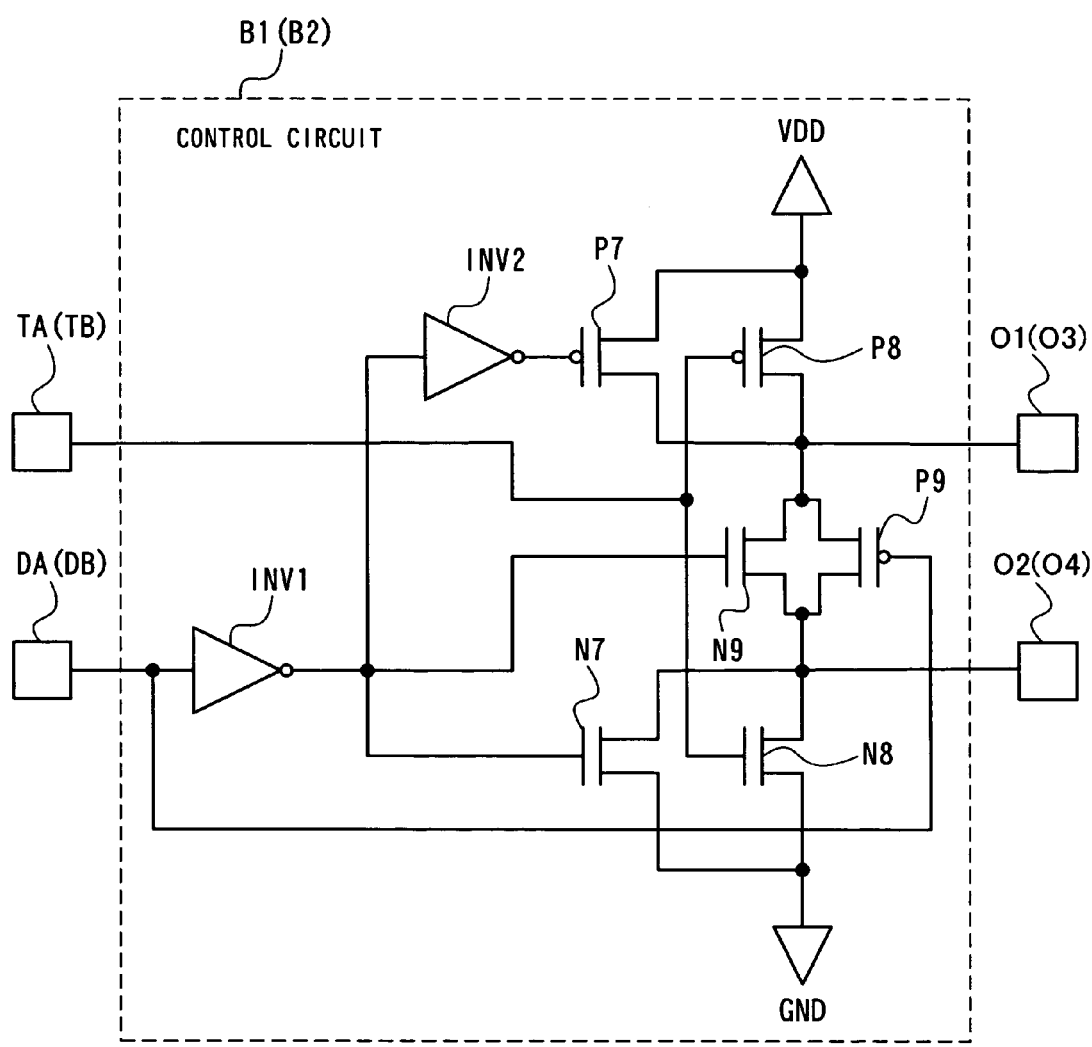
FIG. 3 is a circuit diagram showing a structure of a control circuit in the output buffer circuit according to the first embodiment.

The control circuit B1, B2 is a tri-state-type circuit which includes, as shown in FIG. 3, inverters INV1 and INV2, P channel transistors P7, P8 and P9 and N channel transistors N7, N8 and N9 and has the respective input and output terminals of an input terminal TA (TB), a control terminal DA (DB) and output terminals O1 (O3) and O2 (O4). The control circuit B1, B2 has a function of varying a state of an output by a control signal applied to the control terminal DA (DB).

Figure 4:
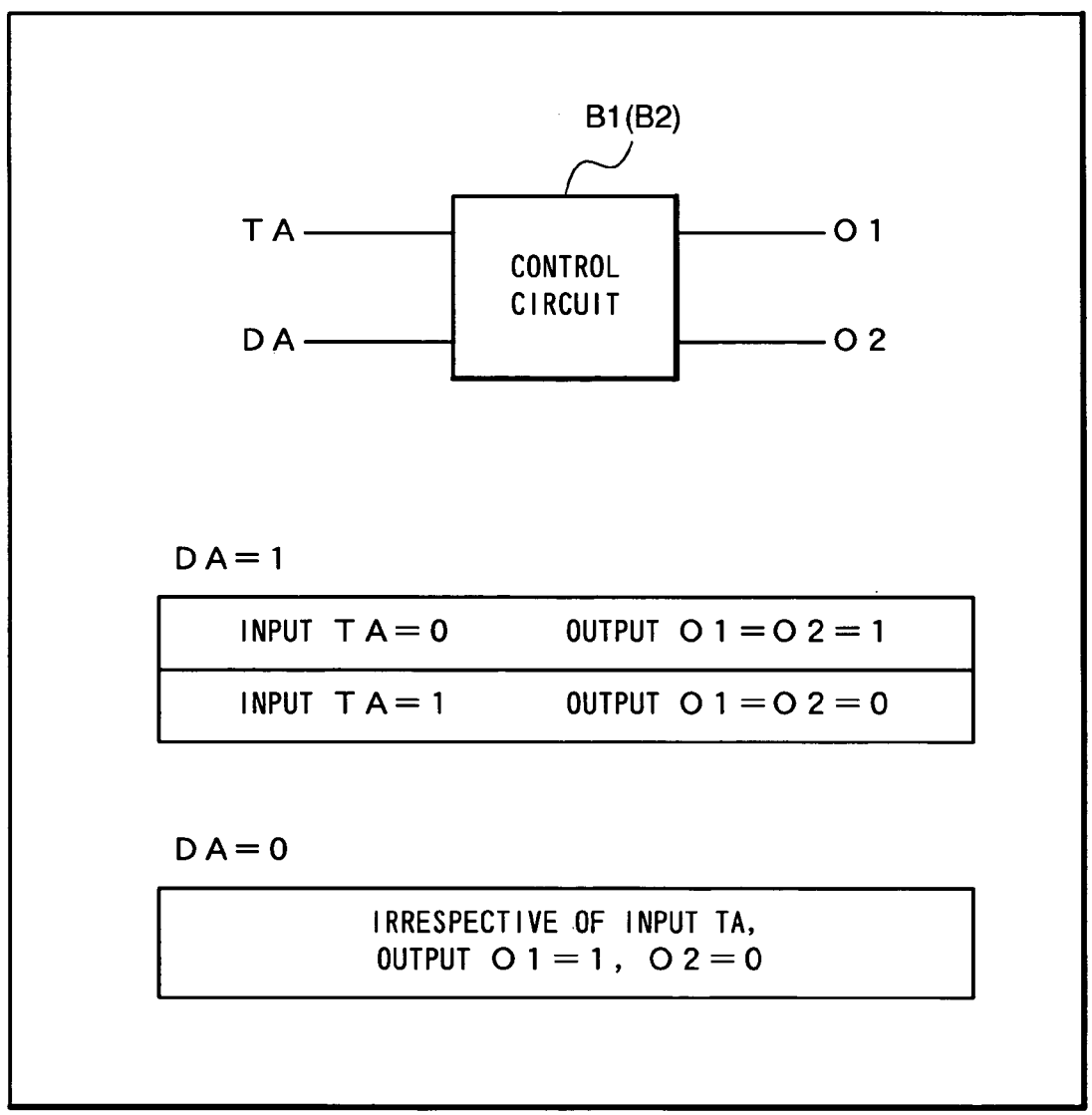
FIG. 4 is a diagram for use in explaining contents of operation of the control circuit according to the first embodiment.

Contents of the operation of the control circuit B1, B2 are shown in FIG. 4. As illustrated in the figure, in a case where a control signal of the control terminal DA is at a high potential (high level: "1"), when the input terminal TA is at "0", the output terminal O1=O2 attains "1" and when the input terminal TA is at "1", the output terminal O1=O2 attains "0". On the other hand, when a control signal of the control terminal DA is at a low potential (low level: "0"), the output terminal O1 attains "1" and O2 attains "0" irrespective of the state of the input terminal TA.

The output terminals O1 and O2 of the control circuit B1 of the first buffer 10 are connected to the inputs of the buffer circuit 10A and the buffer circuit 20A, respectively, and the output terminals O3 and O4 of the control circuit B2 of the second buffer 20 are connected to the control of the buffer circuit 20A.

As illustrated in the circuit example shown in FIG. 2, the buffer circuit 10A of the first buffer 10 is composed of a P channel transistor P1 and an N channel transistor N1, and resistors R1 and R2.

The buffer circuit 20A of the second buffer 20 is composed of P channel transistors P3 and P4 and N channel transistors N3 and N4, and resistors R5 and R6.

Here, the final stage output impedance of the second buffer 20 is set to be higher than the final stage impedance of the first buffer 10. Accordingly, the present output buffer circuit is structured as a circuit having the respective input and output terminals including the input terminal TA and the control terminal DA of the first buffer 10, the input terminal TB and the control terminal DB of the second buffer 20 and an output terminal SOUT.

Next, operation of thus structured output buffer circuit of the present embodiment will be described with reference to the timing charts shown in FIGS. 5 and 6.

When a control signal applied to the control terminals DA and DB is at a high potential ("1"), the control circuits B1 and B2 are at an activation state and the output terminals O1, O2 and O3, O4 invert data applied to the input terminals TA and TB to output the inversion data.

Figure 5:
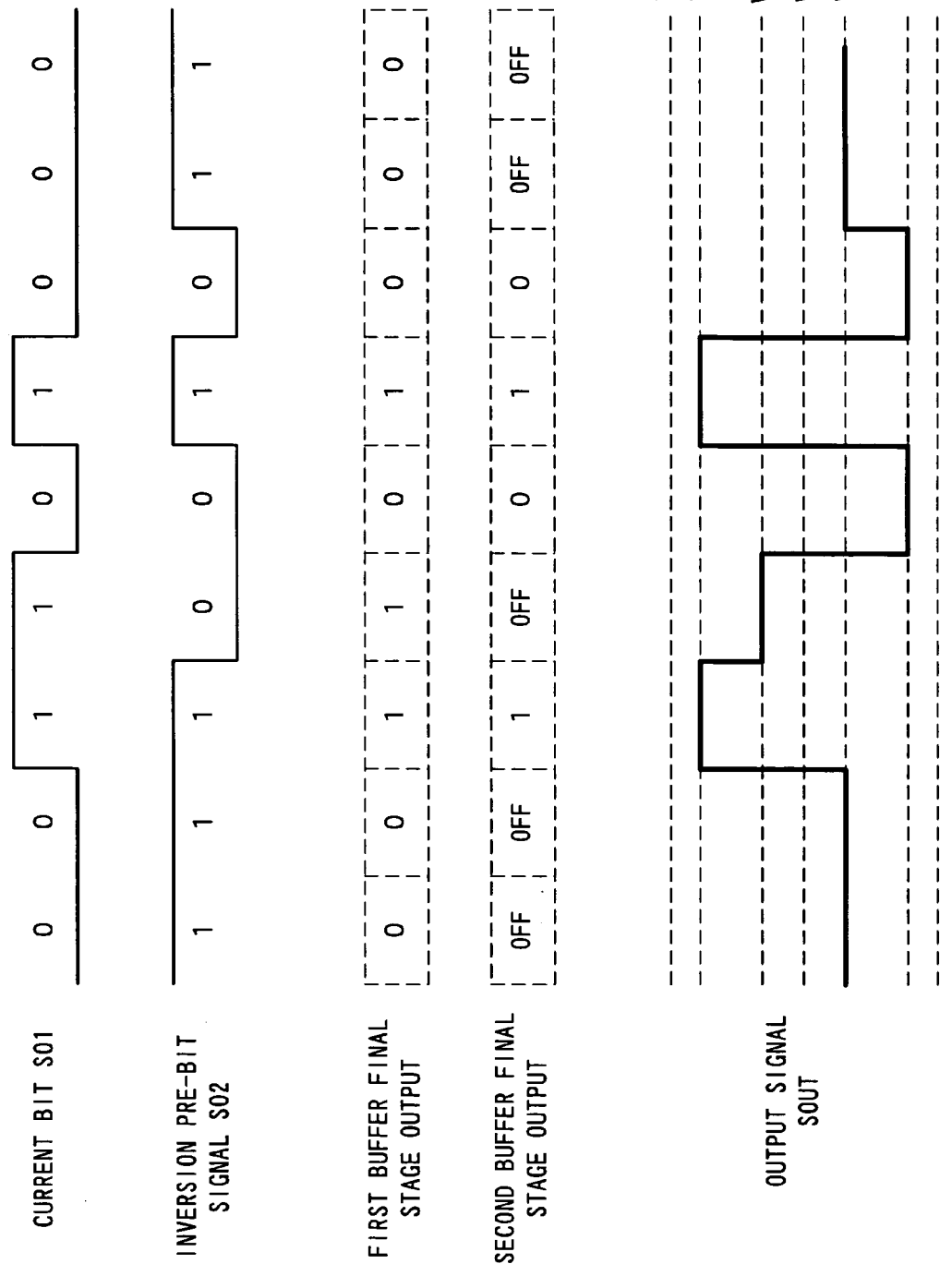

Here, to the input terminal TA, a current bit signal SO1 as a first input signal shown in FIG. 5 is applied and to the input terminal TB, an inversion pre-bit signal SO2 as a second input signal obtained by inverting the current bit signal SO1 to have a delay of one bit is applied.

Since the buffer circuit 10A of the first buffer 10 is an inverter circuit formed of the P channel transistor P1, the N channel transistor N1 and the resistors R1 and R2, it further inverts the data of the output terminals O1 and O2 of the control circuit B1 to output the inversion data (the first buffer final stage output in FIG. 5).

The buffer circuit 20A of the second buffer 20, which forms a tri-state circuit, attains the activation state only when the state of the current bit signal SO1 and that of the inversion pre-bit signal SO2 coincide with each other (SO1=SO2).

Accordingly, only when the data of the current bit signal SO1 changes from "0" to "1" or from "1" to "0" (when the current bit signal SO1 and the inversion pre-bit signal SO2 coincide with each other), the second buffer 20 is turned on to make the first buffer 10 and the second buffer 20 cooperate with each other (current drivability is emphasized) (pre-emphasis function is enabled).

When the current bit signal SO1 and the inversion pre-bit signal SO2 fail to coincide with each other, the final stage output of the second buffer 20 (output of the buffer circuit 20A) is turned off to disable the pre-emphasis function (the second buffer final stage output in FIG. 5).

As a result, the signal waveform of the output signal SOUT attains the form as shown in FIG. 5 to operate as an output buffer circuit with the pre-emphasis function working. As illustrated in FIG. 5, since the circuit is structured to turn off the second buffer 20 when the pre-emphasis function is disabled (at the time of de-pre-emphasis), unnecessary current flowing through the second buffer 20 is cut off at the time of de-pre-emphasis.

Figure 6:
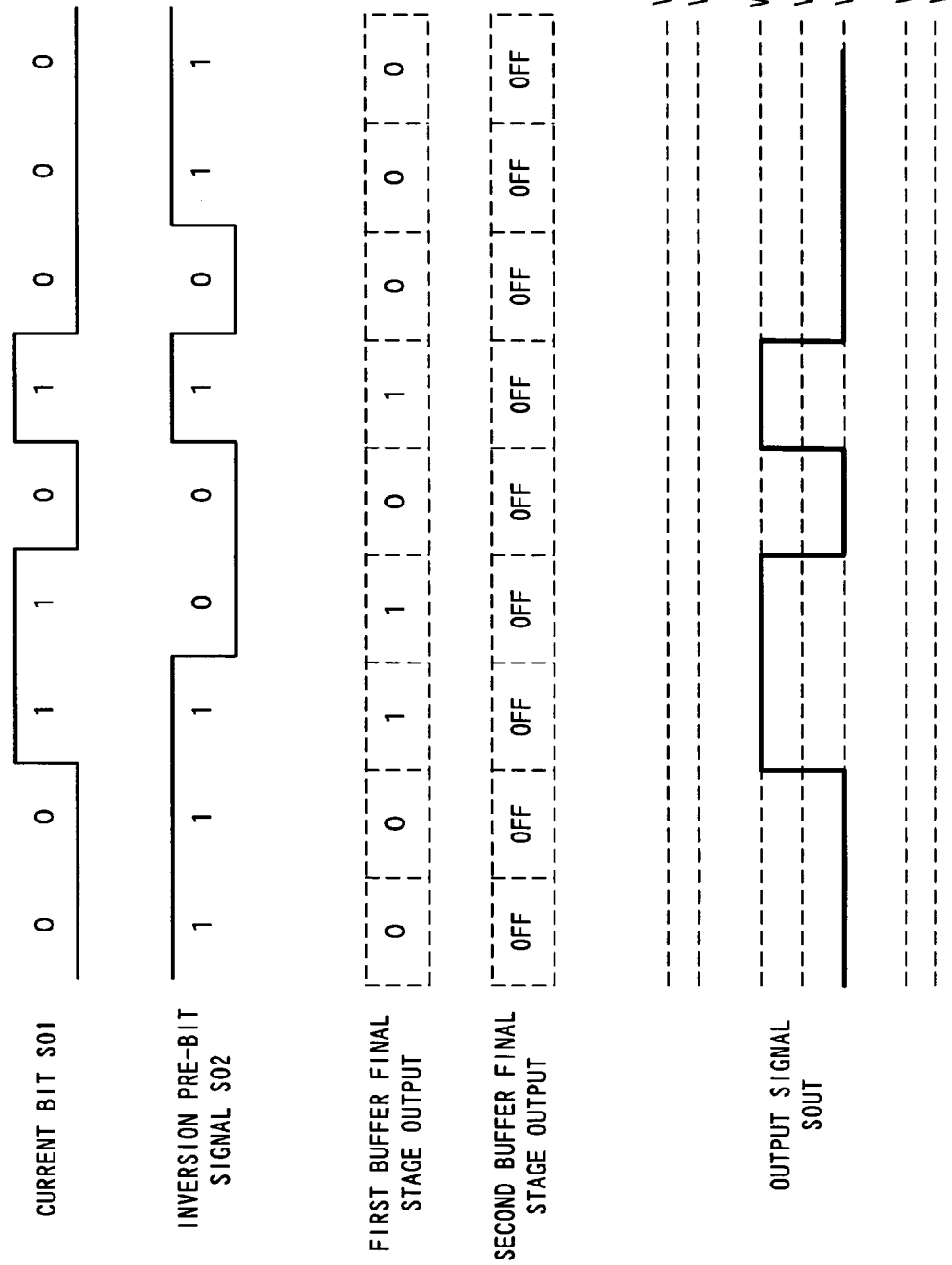
FIG. 6 is a timing chart for use in explaining operation to be conducted when the pre-emphasis function in the output buffer circuit according to the first embodiment is tuned off.

On the other hand, as shown in the timing chart of FIG. 6, when the control signal DA is at a high potential and the control signal DB is at a low potential, the second buffer 20 is turned off to operate as an output buffer circuit having no pre-emphasis function.

When both the control signals DA and DB are at a low potential, both of the first buffer 10 and the second buffer 20 are turned off to bring the output buffer circuit itself to the off state (disabled).

Figure 7:
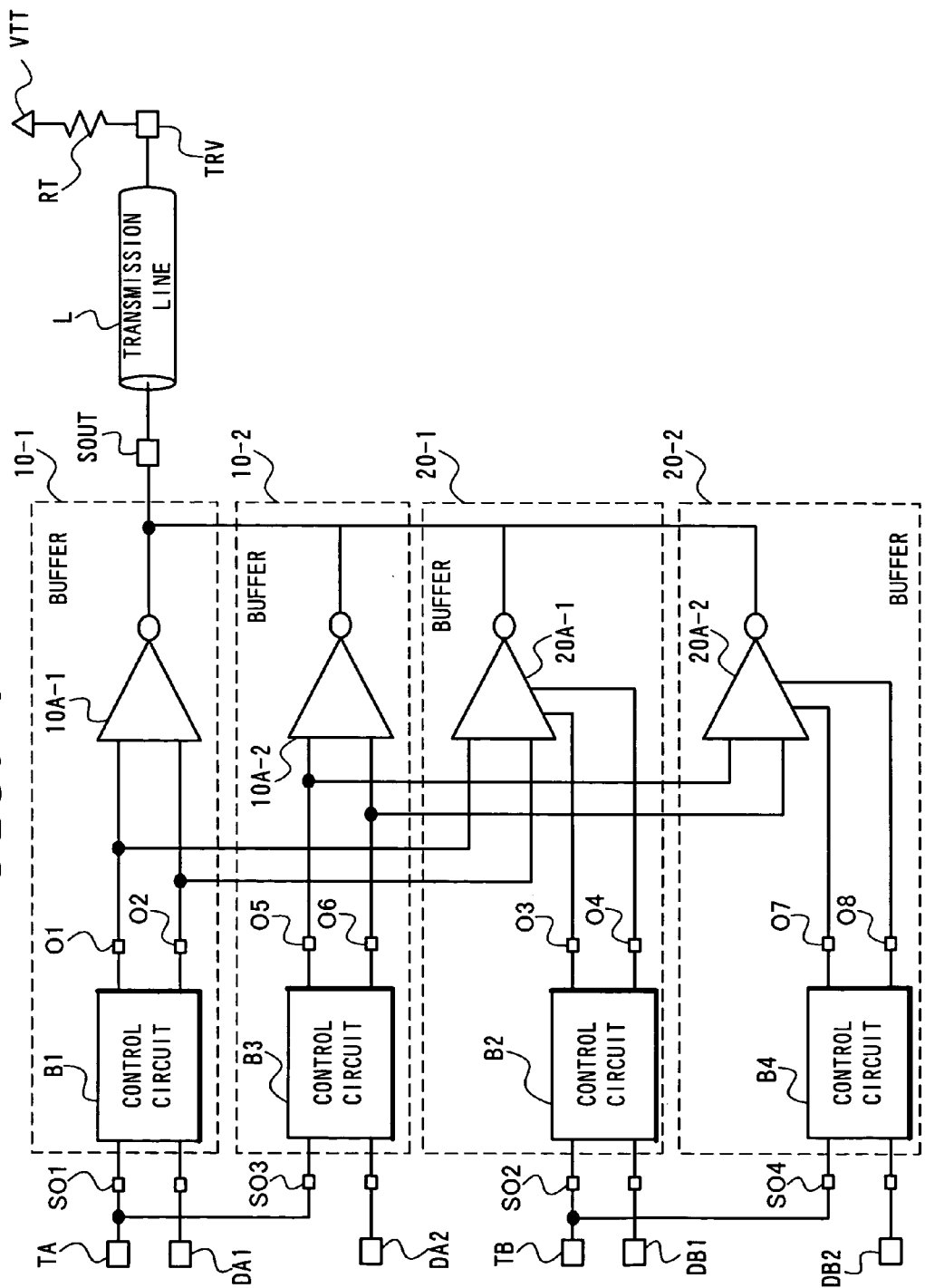
FIG. 7 is a block diagram showing a structure of an output buffer circuit according to a second embodiment of the present invention.

Next, shown as a second embodiment of the present invention is a mode whose basic structure is the same as that of the first embodiment and whose current drivability is further modified. FIG. 7 is a block diagram showing a structure of an output buffer circuit according to the second embodiment of the present invention and FIG. 8 is a circuit diagram showing a specific example of the structure.

Figure 8:
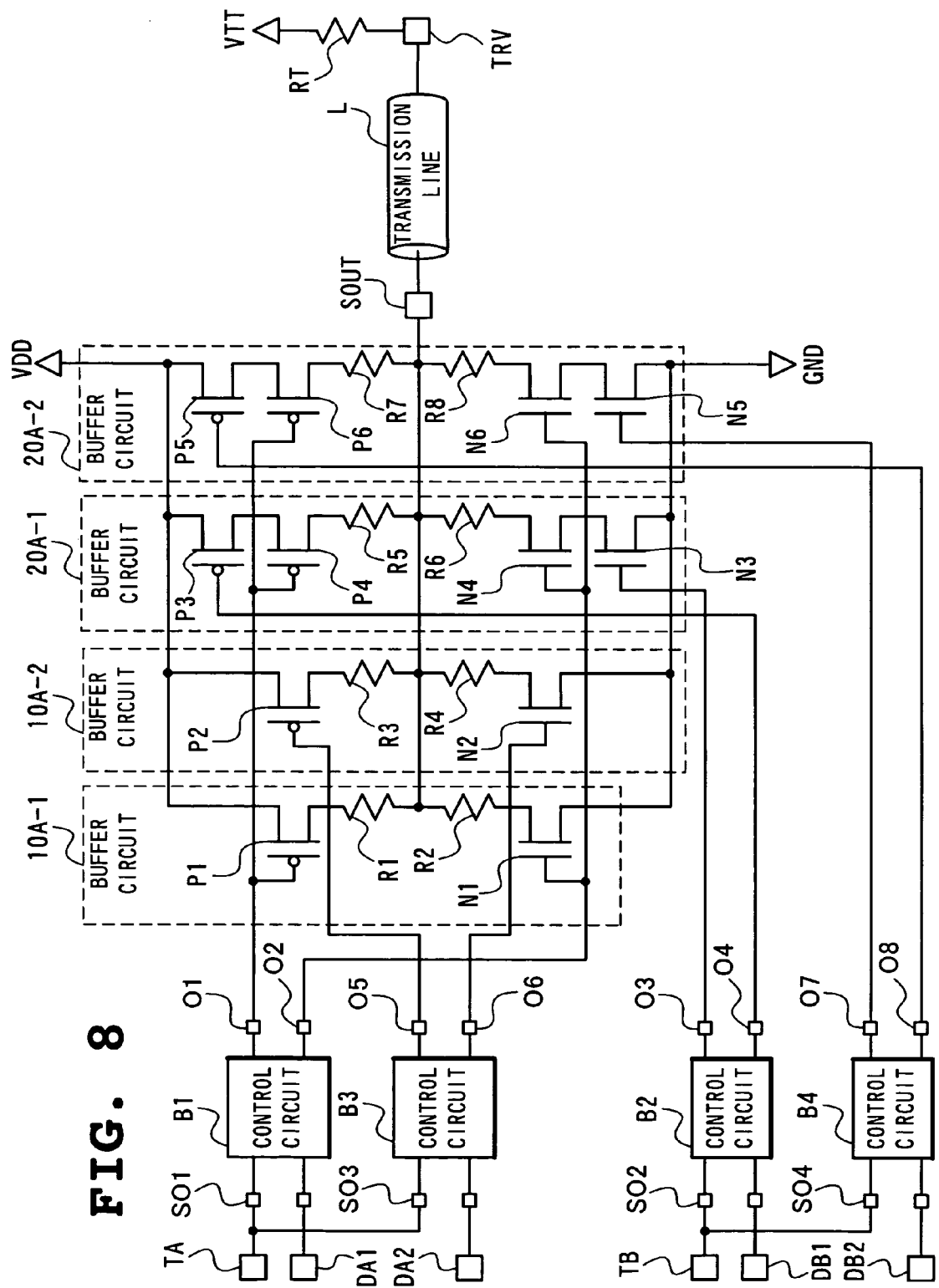
FIG. 8 is a circuit diagram showing a specific circuit structure of the output buffer circuit according to the second embodiment.

In FIGS. 7 and 8, in the output buffer circuit according to the second embodiment, the first buffer and the second buffer of the first embodiment are formed by combining buffers 10-1 and 10-2, and buffers 20-1 and 20-2, respectively, thereby enabling the second buffer to have a variable amount of effects of the pre-emphasis function and the first buffer to have variable current drivability.

The buffer 10-1 forming the first buffer is composed of a buffer circuit 10A-1 and the control circuit B1 and the buffer 10-2 is composed of a buffer circuit 10A-2 and a control circuit B3. The buffer 20-1 forming the second buffer is composed of a buffer circuit 20A-1 and the control circuit B2 and the buffer 20-2 is composed of a buffer circuit 20A-2 and a control circuit B4.

Structure and operation of the control circuits B1 to B4 are the same as those of the circuit according to the first embodiment shown in FIG. 3.

Applied to the control circuit B3 is a signal SO3 which is the same as the current bit signal SO1 and applied to the control circuit B4 is a signal SO4 which is the same as the inversion pre-bit signal SO2.

Furthermore, in the first buffer, the output impedance of one buffer 10-1 is set to be approximately the same as a characteristic impedance of the transmission line L and the output impedance of the other buffer 10-2 is set to be lower than the characteristic impedance of the transmission line L. In a case where the characteristic impedance of the transmission line L is 50 Ohms, for example, set the output impedance of the buffer 10-1 of the first buffer to be 50 Ohms and set the output impedance of the other buffer 10-2 to be lower than 50 Ohms.

In thus structured output buffer circuit according to the second embodiment, when enabling the control circuits B1 and B3, set the control terminal DA1 and the control terminal DA2 to a high potential. This setting is applicable when requiring long-distance transmission or requiring a maximum transfer rate on a matched transmission line.

When the control circuits B1 and B3 are thus enabled, in FIG. 8, the buffer 10-1 (inverter circuit) composed of the P channel transistor P1 and the N channel transistor N1 forming the first buffer and the buffer 10-2 (inverter circuit) composed of the channel transistor P2 and the N channel transistor N2 are connected in parallel, so that the final stage of the first buffer has a low impedance to obtain larger current drivability than that of the output buffer circuit structured according to the first embodiment.

On the other hand, when only the control circuit B1 is enabled and the control circuit B3 is disabled, the buffer 10-2 as a final stage buffer composed of the P channel transistor P2 and the N channel transistor N2 is turned off to have a high impedance, so that application to such a condition of a short transmission distance in which mismatching is liable to occur leads to formation of a circuit with the minimized effect of reflection noise to enable high-speed transmission.

Since setting the amount of effects of the pre-emphasis function of the second buffer to be variable employs the same method as that disclosed in Japanese Patent Laying-Open (Kokai) No. 2002-94365, no detailed description will be made thereof.

Figure 9:
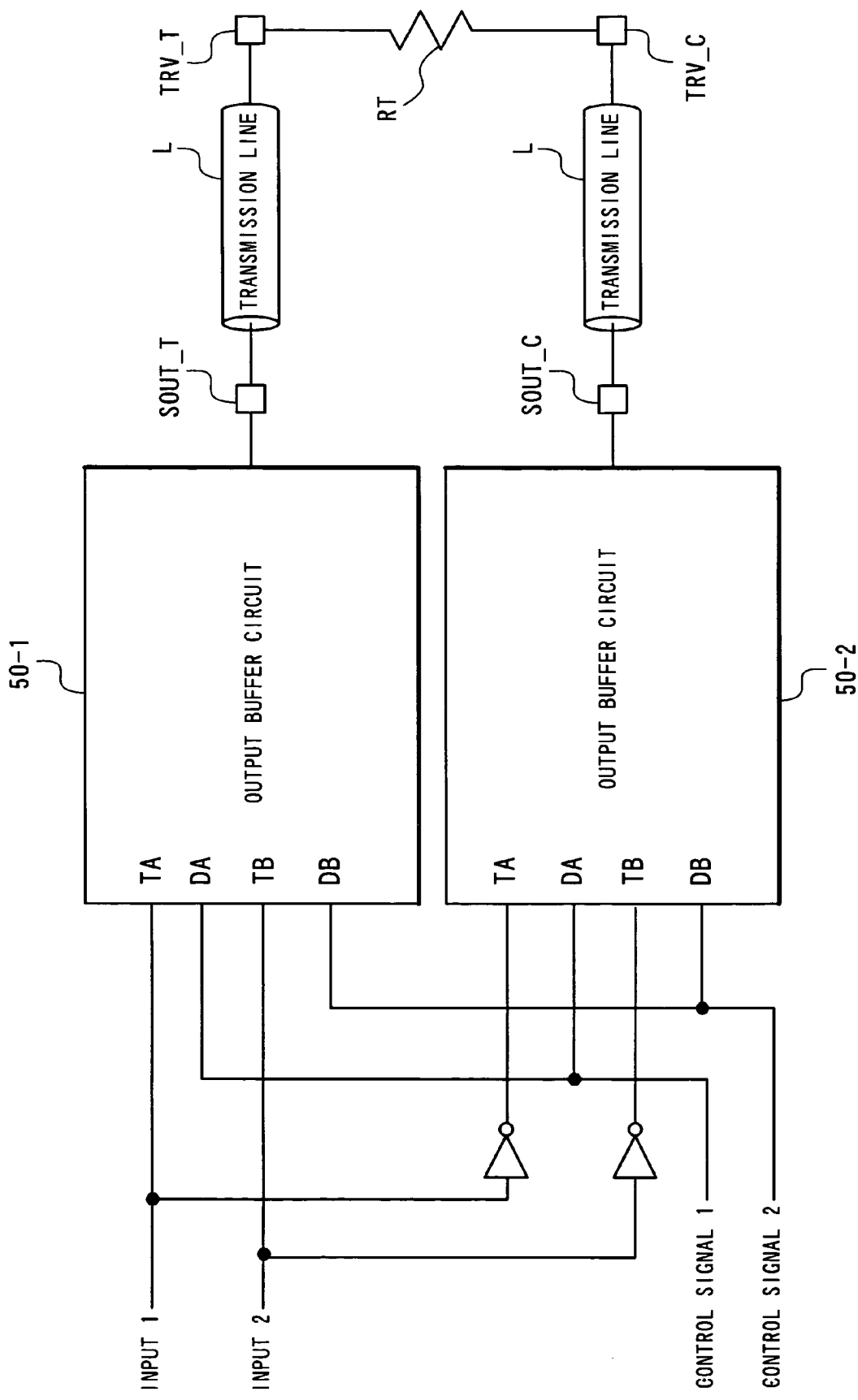
FIG. 9 is a circuit diagram for use in explaining a structure of a differential output circuit to which the output buffer circuit of the present invention is applied.

As a further embodiment, application of the output buffer circuit according to the present invention to a differential output circuit is also possible, which embodiment is shown in FIG. 9.

The differential output circuit shown in FIG. 9 employs two (50-1, 50-2) output buffer circuits according to the first embodiment of the present invention as differential paired outputs, with one used as a positive (+) output and the other as a negative (−) output circuit to line-terminate at reception terminals TRV_T and TRV_C through the resistor RT. As to termination, Thevenin termination at a reception terminal and non-termination are possible.

Although the present invention has been described with respect to the preferred embodiments in the foregoing, the present invention is not limited thereto and can be implemented in variation within the scope of its technical idea.

As described in the foregoing, the present invention attains such excellent effects as set forth below.

Making the second buffer as a tri-state type circuit leads to reduction in current flowing at the time of de-pre-emphasis to realize low power consumption. Moreover, current fluctuation at the time when the pre-emphasis function is changed between on and off is mitigated to reduce noise, thereby realizing high-speed operation at a lower voltage.

Furthermore, with the pre-emphasis function of the second buffer being variable and the current drivability of the first buffer being variable, setting an output impedance to be the same as that of a transmission line when the circuit is structured to have a large effect of mismatched reflection noise (in a case where the transmission line is short or the like) and conversely setting the output impedance to be low (setting the current drivability to be large) when the effect of the mismatched reflection noise is small (in a case of a long distance transmission line such as a cable transmission) allows high-speed transmission even in a long distance, thereby obtaining an output buffer which can provide an optimum current drivability according to conditions of the transmission line.

Moreover, while in a conventional output buffer circuit, an output impedance of a second buffer needs to be set to be higher than an output impedance of a first buffer to an extent that attenuation of a signal on a transmission line is improved, the present invention is structured to turn off the second buffer at the time of de-pre-emphasis to have an effect of eliminating the need of taking an output impedance of the second buffer into consideration.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

The invention claimed is:

1. An output buffer circuit having a pre-emphasis function of emphasizing a signal waveform in data transmission according to an attenuation of a transmission line, comprising:

a first buffer which receives a first input signal which gives a logical value of a signal to drive said transmission line and a second buffer which drives said transmission line in cooperation with said first buffer, and an element which applies to said second buffer a second input signal having a predetermined logical relationship with said first input signal as an applied signal to disable the pre-emphasis function by turning off said second buffer when the first input signal and the second input signal fail to coincide with each other, wherein, when the pre-emphasis function is disabled, current flowing through said second buffer is cut off.

2. The output buffer circuit as set forth in claim 1, wherein said element turns off said second buffer to cut off current when the pre-emphasis function is disabled.

3. The output buffer circuit as set forth in claim 1, wherein said element applies to said second buffer the second input signal having the predetermined logical relationship with the first input signal as the applied signal to enable the pre-emphasis function of said second buffer when said first input signal and said second input signal coincide with each other in relationship.

4. The output buffer circuit as set forth in claim 1, comprising:

wherein said element turns off said second buffer to cut off current when the pre-emphasis function is disabled, and wherein said element applies to said second buffer the second input signal having the predetermined logical relationship with the first input signal as the applied signal to enable the pre-emphasis function of said second buffer when said first input signal and said second input signal coincide with each other in relationship.

5. An output buffer circuit having a pre-emphasis function of emphasizing a signal waveform in data transmission according to an attenuation of a transmission line, comprising:

a first buffer which receives a first input signal which gives a logical value of a signal to drive said transmission line and a second buffer which drives said transmission line in cooperation with said first buffer, wherein, when the pre-emphasis function is disabled, current flowing through said second buffer is cut off, and a control circuit provided in said first buffer and said second buffer which turns on/off said first buffer and said second buffer in response to a control signal, wherein, when both control signals applied to said control circuits of said first buffer and said second buffer are at a high potential, both of said first buffer and said second buffer are turned on, wherein, when the control signal of said first buffer is at a high potential and said control signal of said second buffer is at a low potential, said second buffer is turned off, and wherein, when both of said control signals are at a low potential, said first buffer and said second buffer are both turned off.

6. The output buffer circuit as set forth in claim 1, wherein said element turns off said second buffer to cut off current when the pre-emphasis function is disabled, wherein said element includes a control circuit provided in said first buffer and said second buffer which turns on/off said first buffer and said second buffer in response to a control signal, wherein, when both control signals applied to said control circuits of said first buffer and said second buffer are at a high potential, both of said first buffer and said second buffer are turned on, wherein, when the control signal of said first buffer is at a high potential and said control signal of said second buffer is at a low potential, said second buffer is turned off, and wherein, when both of said control signals are at a low potential, said first buffer and said second buffer are both turned off.

7. The output buffer circuit as set forth in claim 1, wherein said element applies to said second buffer the second input signal having the predetermined logical relationship with the first input signal as the applied signal to enable the pre-emphasis function of said second buffer when said first input signal and said second input signal coincide with each other in relationship, wherein said element includes a control circuit provided in said first buffer and said second buffer which turns on/off said first buffer and said second buffer in response to a control signal, wherein, when both control signals applied to said control circuits of said first buffer and said second buffer are at a high potential, both of said first buffer and said second buffer are turned on, wherein, when the control signal of said first buffer is at a high potential and said control signal of said second buffer is at a low potential, said second buffer is turned off, and wherein, when both of said control signals are at a low potential, said first buffer and said second buffer are both turned off.

8. The output buffer circuit as set forth in claim 1, wherein said element turns off said second buffer to cut off current when the pre-emphasis function is disabled, wherein said element applies to said second buffer the second input signal having the predetermined logical relationship with the first input signal as the applied signal to enable the pre-emphasis function of said second buffer when said first input signal and said second input signal coincide with each other in relationship, wherein said element includes a control circuit provided in said first buffer and said second buffer which turns on/off said first buffer and said second buffer in response to a control signal, wherein, when both control signals applied to said control circuits of said first buffer and said second buffer are at a high potential, both of said first buffer and said second buffer are turned on, wherein, when the control signal of said first buffer is at a high potential and said control signal of said second buffer is at a low potential, said second buffer is turned off, and wherein, when both of said control signals are at a low potential, said first buffer and said second buffer are both turned off.

9. The output buffer circuit as set forth in claim 1, wherein said element applies to said second buffer the second input signal having the predetermined logical relationship with the first input signal as the applied signal to enable the pre-emphasis function of said second buffer when said first input signal and said second input signal coincide with each other in relationship, and wherein said second input signal comprises a signal obtained by inverting said first input signal to have a delay of one bit.

10. The output buffer circuit as set forth in claim 1, comprising:

a control circuit provided in said first buffer and said second buffer which turns on/off said first buffer and said second buffer in response to a control signal, wherein, when both control signals applied to said control circuits of said first buffer and said second buffer are at a high potential, both of said first buffer and said second buffer are turned on, wherein, when the control signal of said first buffer is at a high potential and said control signal of said second buffer is at a low potential, said second buffer is turned off, wherein, when both of said control signals are at a low potential, said first buffer and said second buffer are both turned off, and wherein said element which applies to said second buffer the second input signal having the predetermined logical relationship with the first input signal as the applied signal to enable the pre-emphasis function of said second buffer when said first input signal and said second input signal coincide with each other in relationship, and wherein said second input signal comprises a signal obtained by inverting said first input signal to have a delay of one bit.

11. The output buffer circuit as set forth in claim 1, wherein said first buffer comprises two first buffers in combination, and said second buffer comprises two second buffers in combination, wherein at least one of both of said first buffers are turned on and only one of said first buffers is turned on to vary current drivability, and at least one of both of said first buffers are turned on and only one of said first buffers is turned on to vary effects of the pre-emphasis function.

12. The output buffer circuit as set forth in claim 1, wherein said first buffer comprises two first buffers in combination, and said second buffer comprises two second buffers in combination, wherein at least one of both of said first buffers are turned on and only one of said first buffers is turned on to vary current drivability, at least one of both of said first buffers are turned on and only one of said first buffers is turned on to vary effects of the pre-emphasis function, and an output impedance of one of said first buffers is set to be substantially the same as a characteristic impedance of said transmission line and an output impedance of the other buffer is set to be lower than the characteristic impedance of said transmission line.

13. A differential output circuit employing a plurality of output buffer circuits to apply one as a positive output and the other as a negative output circuit, which circuits include a pre-emphasis function of emphasizing a signal waveform in data transmission according to an attenuation of a transmission line, and include a first buffer which receives an input signal which gives a logical value of a signal to drive said transmission line and a second buffer which drives said transmission line in cooperation with said first buffer to, when the pre-emphasis function is disabled, cut off current flowing through said second buffer, wherein said output buffer circuit includes:

an element which applies to said second buffer a second input signal having a predetermined logical relationship with a first input signal as an applied signal to disable the pre-emphasis function by turning off said second buffer when the signals fail to coincide with each other.

14. The differential output circuit as set forth in claim 13, wherein said element turns off said second buffer to cut off current when the pre-emphasis function is disabled.

15. The differential output circuit as set forth in claim 13, wherein said element applies to said second buffer the second input signal having the predetermined logical relationship with the first input signal as the applied signal to enable the pre-emphasis function of said second buffer when said first input signal and said second input signal coincide with each other in relationship.

16. The output buffer circuit as set forth in claim 1, wherein an output impedance of said second buffer is higher than an output impedance of said first buffer.

17. The output buffer circuit as set forth in claim 1, comprising:

means for turning said second buffer off to cut off current when the pre-emphasis function is disabled, wherein said means for turning turns said first buffer and said second buffer at least one of on and off in response to control signals, wherein, when both of said control signals applied to said means for turning are at a high potential, both of said first buffer and said second buffer are turned on, wherein, when the control signal of said first buffer is at a high potential and said control signal of said second buffer is at a low potential, said second buffer is turned off, and wherein, when both of said control signals are at a low potential, said first buffer and said second buffer are both turned off.

18. The output buffer circuit as set forth in claim 1, wherein said element comprises:

a first control circuit provided in said first buffer which turns on/off said first buffer in response to a first control signal; and a second control circuit provided in said second buffer which turns on/off said second buffer in response to a second control signal.

19. The output buffer circuit as set forth in claim 18, wherein said element turns off said second buffer to cut off current when the pre-emphasis function is disabled, and wherein said element applies to said second buffer the second input signal having the predetermined logical relationship with the first input signal as the applied signal to enable the pre-emphasis function of said second buffer when said first input signal and said second input signal coincide with each other in relationship.

20. The output buffer circuit as set forth in claim 18, wherein, when said first control signal applied to said first control circuit of said first buffer and said second control signal applied to said second control circuit of said second buffer each are at a high potential, both of said first buffer and said second buffer are turned on, wherein, when said first control signal applied to said first control circuit of said first buffer is at a high potential and said second control signal applied to said second control circuit of said second buffer is at a low potential, said second buffer is turned off, and wherein, when said first control signal applied to said first control circuit of said first buffer and said second control signal applied to said second control circuit of said second buffer each are at a low potential, said first buffer and said second buffer are both turned off.

* * * * *